(12) United States Patent
Jeon

(10) Patent No.: US 7,906,272 B2
(45) Date of Patent: Mar. 15, 2011

(54) METHOD OF FORMING A PATTERN OF A SEMICONDUCTOR DEVICE

(75) Inventor: Sung Min Jeon, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 227 days.

(21) Appl. No.: 12/132,556

(22) Filed: Jun. 3, 2008

(65) Prior Publication Data

US 2009/0181543 A1    Jul. 16, 2009

(30) Foreign Application Priority Data

Jan. 14, 2008    (KR) .................. 10-2008-0003953

(51) Int. Cl.
G03F 7/00    (2006.01)

(52) U.S. Cl. ........................................ 430/313; 216/17

(58) Field of Classification Search .......... 438/947–952; 430/313; 216/17
See application file for complete search history.

(56) References Cited

U.S. PATENT DOCUMENTS

| | | | | |
|---|---|---|---|---|
| 5,895,740 | A * | 4/1999 | Chien et al. | 430/313 |
| 6,660,636 | B1 * | 12/2003 | Li et al. | 438/690 |
| 7,018,780 | B2 * | 3/2006 | Vahedi et al. | 430/314 |
| 7,576,010 | B2 * | 8/2009 | Lee et al. | 438/717 |
| 2007/0269746 | A1 * | 11/2007 | Nakamura | 430/315 |
| 2008/0050919 | A1 * | 2/2008 | Van Aelst et al. | 438/702 |
| 2008/0108223 | A1 * | 5/2008 | Wang et al. | 438/700 |

FOREIGN PATENT DOCUMENTS

| | | |
|---|---|---|
| KR | 1020010062663 A | 7/2001 |
| KR | 100642886 B1 | 10/2006 |
| KR | 1020060110097 A | 10/2006 |
| KR | 1020070109787 A | 11/2007 |

* cited by examiner

*Primary Examiner* — Matthew W Such
*Assistant Examiner* — Ali Naraghi
(74) *Attorney, Agent, or Firm* — Kilpatrick Townsend & Stockton LLP

(57) ABSTRACT

In a method of forming patterns of a semiconductor device, a to-be-etched layer is formed on a semiconductor substrate. First etch mask patterns are formed over the to-be-etched layer. An auxiliary layer is formed on the first etch mask patterns and the to-be-etched layer. The auxiliary layer is thicker on upper sidewalls of the first etch mask patterns than on lower sidewalls thereof. Second etch mask patterns are formed in concave portions of the auxiliary layer. The auxiliary layer between the first and second etch mask patterns is removed. The to-be-etched layer is patterned using the first and second etch mask patterns as an etch mask.

11 Claims, 5 Drawing Sheets

METHOD OF FORMING A PATTERN OF A SEMICONDUCTOR DEVICE

CROSS-REFERENCES TO RELATED APPLICATIONS

The present application claims priority to Korean patent application number 10-2008-03953, filed on Jan. 14, 2008, which is incorporated by reference in its entirety.

BACKGROUND OF THE INVENTION

The present invention relates to a method of forming patterns of a semiconductor device and, more particularly, to a method of forming micro patterns of a semiconductor device which have a pitch lower than resolutions of an exposure apparatus.

A minimum pitch of patterns of semiconductor devices, which are formed in a photolithography process, is determined according to a wavelength of exposure light used in an exposure apparatus. To form patterns having a smaller pitch in highly integrated semiconductor devices, light having a short wavelength is used. Processes employing X-ray or E-beam may be used for forming semiconductor devices having a small pitch, but these procedures remain in the experimental stage. A Double Exposure and Etch Technology (DEET) has been proposed to address the limitations of X-ray and E-beam procedures.

FIGS. 1A to 1C are sectional views illustrating the DEET process. Referring to FIG. 1A, a first photoresist PR1 is coated over a semiconductor substrate 10 including a to-be-etched layer 11. The first photoresist PR1 is patterned using exposure and development processes. The to-be-etched layer 11 is etched using the patterned first photoresist PR1 as a mask. A line width and a space width of the etched to-be-etched layer 11 are 150 nm and 50 nm, respectively.

The first photoresist PR1 is removed. A second photoresist PR2 is coated on the entire surface. The second photoresist PR2 is patterned using exposure and development processes so that a part of the to-be-etched layer 11 is exposed, as shown in FIG. 1B.

Referring to FIG. 1C, the to-be-etched layer 11 is etched again using the patterned second photoresist PR2 as a mask, thereby forming final patterns having a line and space width of 50 nm. The second photoresist PR2 is then removed.

During the exposure process of the second photoresist PR2, overlay accuracy is directly concerned with the Critical Dimension (CD) variation of the final patterns. The overlay accuracy of an exposure apparatus is difficult to control within 10 nm, which makes it difficult to decrease the CD variation of the final patterns. There is another difficulty in controlling the Optical Proximity Correction (OPC) due to circuit isolation according to dual exposure.

BRIEF SUMMARY OF THE INVENTION

The present invention is directed toward a method of forming patterns of a semiconductor device. In the method, first etch mask patterns are formed using photoresist patterns employing an exposure process. An auxiliary layer of a specific thickness is formed on sidewalls of the first etch mask patterns. Second etch mask patterns are formed in spaces between the first etch mask patterns including the auxiliary layer. The micro patterns are then formed using the first and second etch mask patterns.

According to an aspect of the present invention, a method of forming patterns of a semiconductor device includes forming a to-be-etched layer on a semiconductor substrate. First etch mask patterns are formed over the to-be-etched layer. An auxiliary layer is formed on the first etch mask patterns and the to-be-etched layer. The auxiliary layer is thicker on upper sidewalls of the first etch mask patterns than on lower sidewalls thereof. Second etch mask patterns are formed in concave portions of the auxiliary layer. The auxiliary layer is removed between the first and second etch mask patterns. The to-be-etched layer is patterned using the first and second etch mask patterns as an etch mask.

The to-be-etched layer is formed of a Spin On Carbon (SOC) layer. The first etch mask patterns and the second etch mask patterns are formed of a Multi-Functional Hard Mask (MFHM) such as a Bottom Anti-Reflective Coating (BARC) layer containing silicon (Si).

A pitch of the first etch mask patterns is twice as large as a pitch of the second etch mask patterns.

The auxiliary layer is formed of a carbon layer containing fluorine.

According to another aspect of the present invention, a method of forming patterns of a semiconductor device includes forming a to-be-etched layer on a semiconductor substrate. First etch mask patterns are formed over the to-be-etched layer. An auxiliary layer is formed on the first etch mask patterns and the to-be-etched layer. The auxiliary layer is thicker on lower sidewalls of the first etch mask patterns than on upper sidewalls thereof. Second etch mask patterns are formed in concave portions of the auxiliary layer. The auxiliary layer is removed between the first and second etch mask patterns. The to-be-etched layer is patterned using the first and second etch mask patterns as an etch mask.

The to-be-etched layer is formed of a SOC layer. The first etch mask patterns and the second etch mask patterns is formed of a MFHM.

A pitch of the first etch mask patterns is twice as large as a pitch the second etch mask patterns.

The auxiliary layer is formed of a carbon layer containing fluorine.

DESCRIPTION OF SPECIFIC EMBODIMENTS

Specific embodiments according to the present invention will be described with reference to the accompanying drawings. The present invention is not limited to the disclosed embodiments, but may be implemented in various manners. The embodiments are provided to complete the disclosure of the present invention and to allow those having ordinary skill in the art to understand the present invention. The present invention is defined by the scope of the claims.

FIGS. 2A to 2F are sectional views illustrating a method of forming an isolation layer of a semiconductor device according to a first embodiment of the present invention.

Figure 1A:
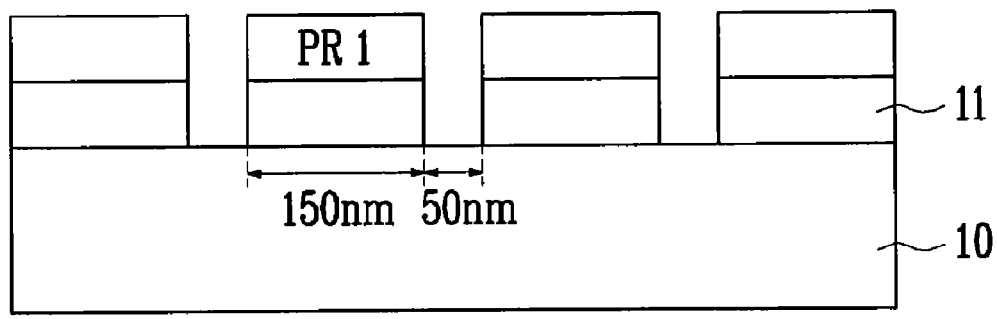
FIGS. 1A to 1C are sectional views illustrating the DEET process.
Figure 1B:
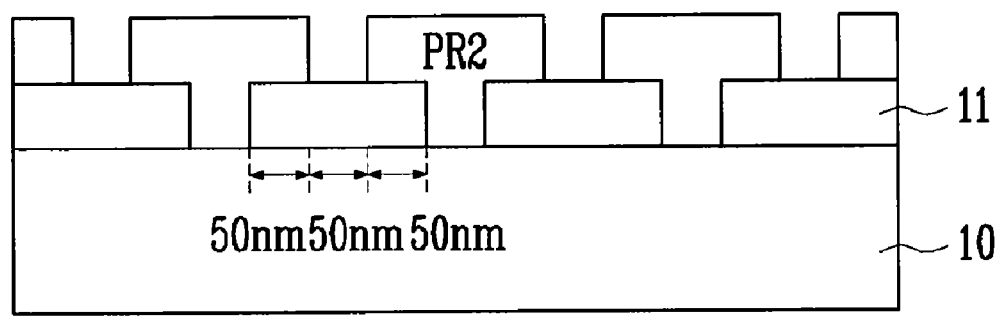
Figure 1C:
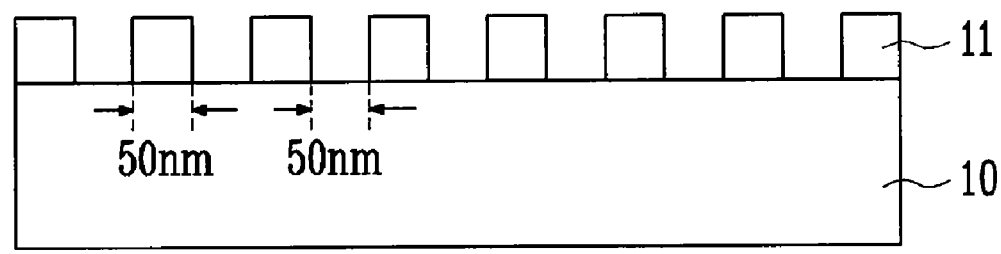
Figure 2A:
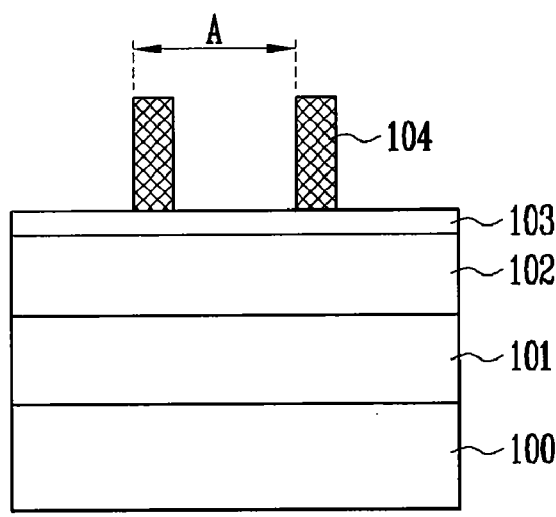
FIGS. 2A to 2F are sectional views illustrating a method of forming an isolation layer of a semiconductor device according to a first embodiment of the present invention.

Referring to FIG. 2A, a to-be-etched layer 101, a first etch mask layer 102, a Bottom Anti-Reflective Coating (BARC) layer 103, and photoresist patterns 104 are formed over a semiconductor substrate 100. A pitch 'A' of the photoresist patterns 104 can be twice as wide as patterns to be subsequently formed.

The to-be-etched layer 101 can be formed of a Spin On Carbon (SOC) layer. The to-be-etched layer 101 can be formed to a thickness of 1000 to 3000 angstroms. After the to-be-etched layer 101 is formed, a bake process can be carried out in a temperature range of 150 to 300 degrees Celsius for 45 to 120 seconds. Cooling can be then performed in a plate of 20 to 30 degrees Celsius for 45 to 120 seconds.

The first etch mask layer 102 can be formed of a Multi-Functional Hard Mask (MFHM) such as a BARC layer containing silicon (Si). In a subsequent etch process, there is a difference in the etch rate between the MFHM layer and the to-be-etched layer 101, which is formed of the SOC layer, because the MFHM layer contains Si. An additional key open process for aligning the photoresist patterns 104 when the photoresist patterns 104 are formed is required because the MFHM layer is transparent.

The first etch mask layer 102 can be formed to a thickness of 200 to 1000 angstroms. After the first etch mask layer 102 is formed, a bake process can be carried out in a temperature range of 150 to 300 degrees Celsius for 45 to 120 seconds. Cooling can then be performed in a plate of 20 to 30 degrees Celsius for 45 to 120 seconds.

The BARC layer 103 can be formed to a thickness of 200 to 1000 angstroms. After the BARC layer 103 is formed, a bake process can be carried out in a temperature range of 150 to 300 degrees Celsius for 45 to 120 seconds. Cooling can then be performed in a plate of 20 to 30 degrees Celsius for 45 to 120 seconds.

Figure 2B:
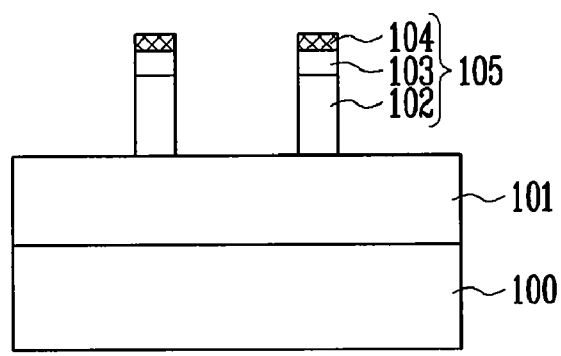

Referring to FIG. 2B, the BARC layer 103 and the first etch mask layer 102 are patterned by performing an etch process employing the photoresist patterns 104, thereby forming first etch mask patterns 105.

Figure 2C:
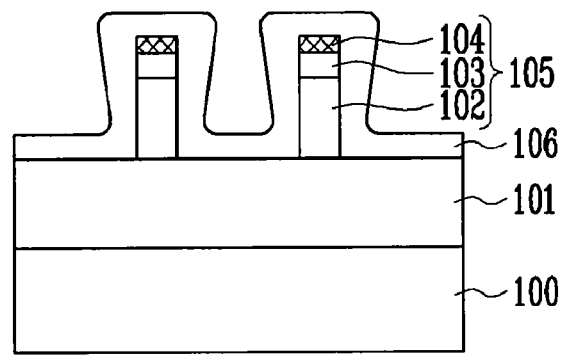

Referring to FIG. 2C, an auxiliary layer 106 is formed on the entire surface of the to-be-etched layer 101, including the first etch mask patterns 105. Specifically, the auxiliary layer 106 is formed on sidewalls and top surfaces of the first etch mask patterns 105. A space between the first etch mask patterns 105 is as wide as the pitch of the first etch mask patterns 105. The auxiliary layer 106 can be formed of a carbon layer containing fluorine. If the auxiliary layer 106 is formed of the carbon layer containing fluorine, the thickness of the auxiliary layer 106 formed on the sidewalls of the first etch mask patterns 105 is constant. Alternatively, the auxiliary layer 106 formed on upper sidewalls of the first etch mask patterns 105 may be thicker than the auxiliary layer 106 formed on lower sidewalls of the first etch mask patterns 105.

Figure 2D:
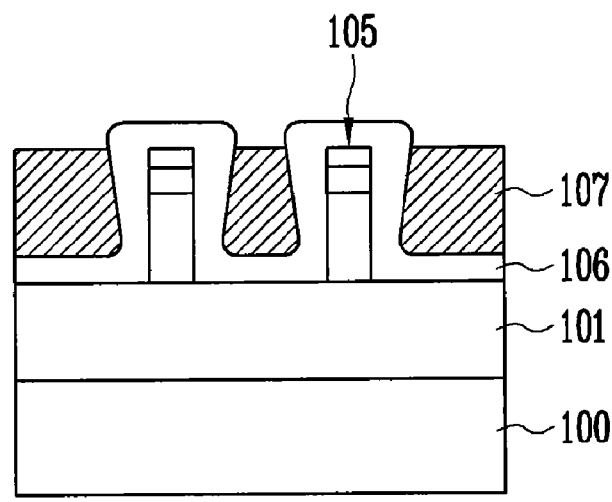

Referring to FIG. 2D, a second etch mask material is deposited on the entire surface including the auxiliary layer 106. An etch process is performed so that the etch mask material remains in concave portions of the auxiliary layer 106, thereby forming second etch mask patterns 107. The second etch mask patterns 107 can be formed of a MFHM such as a BARC layer containing Si.

Figure 2E:
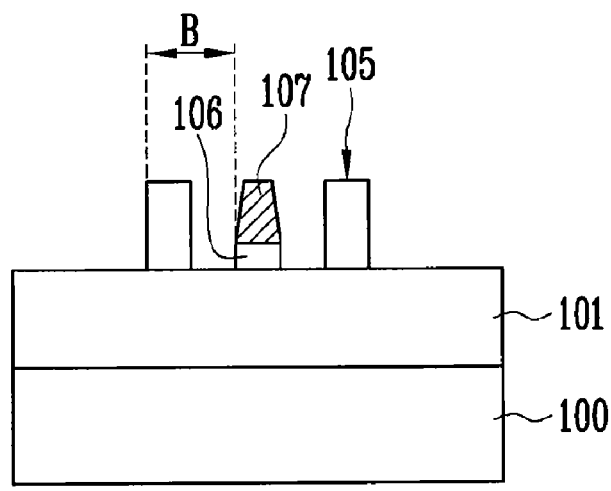

Referring to FIG. 2E, the auxiliary layer 106, which is exposed by performing an etch process, is removed such that the first etch mask patterns 105 and the second etch mask patterns 107 are exposed. The auxiliary layer 106 remains below the second etch mask pattern 107. The second etch mask pattern 107 has a trapezoidal shape having an upper width that is smaller than a lower width.

A pitch 'B' of the first etch mask pattern 105 and the second etch mask pattern 107 is half the pitch of the photoresist patterns 104 shown in FIG. 2A.

Figure 2F:
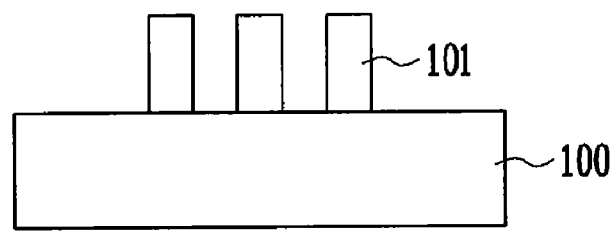

Referring to FIG. 2F, the to-be-etched layer is patterned by performing an etch process employing the first etch mask patterns 105 and the second etch mask pattern 107, thereby forming micro patterns 101.

Figure 3A:
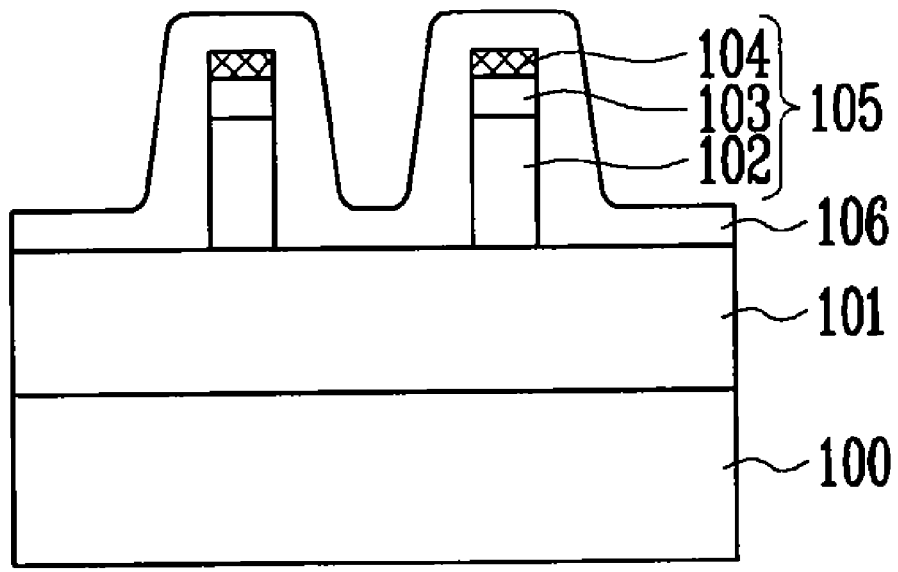
FIGS. 3A and 3D are sectional views illustrating a method of forming an isolation layer of a semiconductor device according to a second embodiment of the present invention.
Figure 3B:
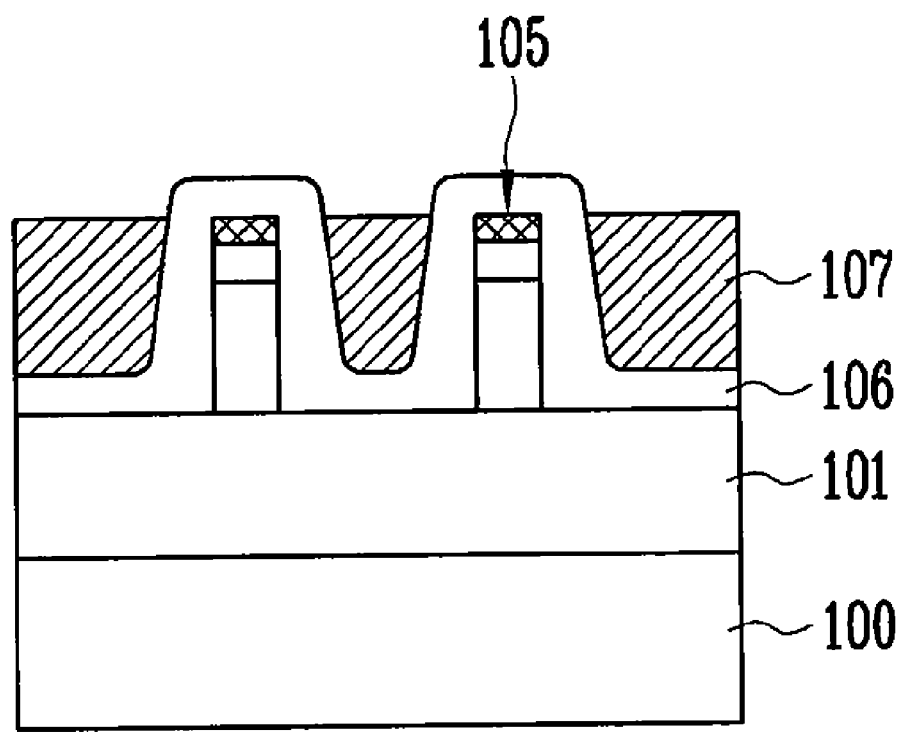
Figure 3C:
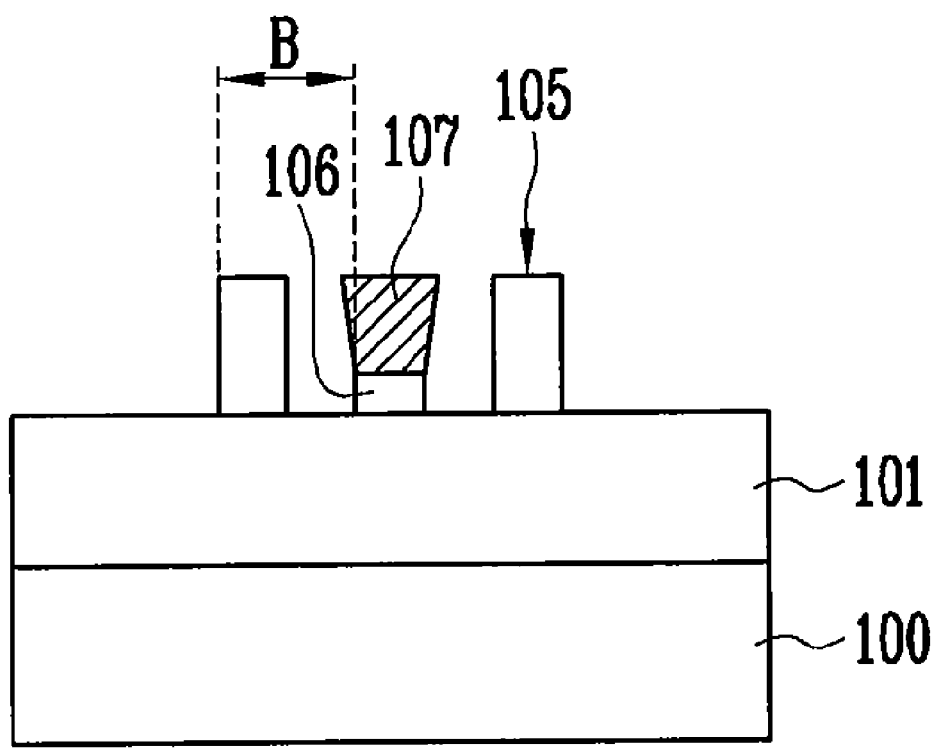
Figure 3D:
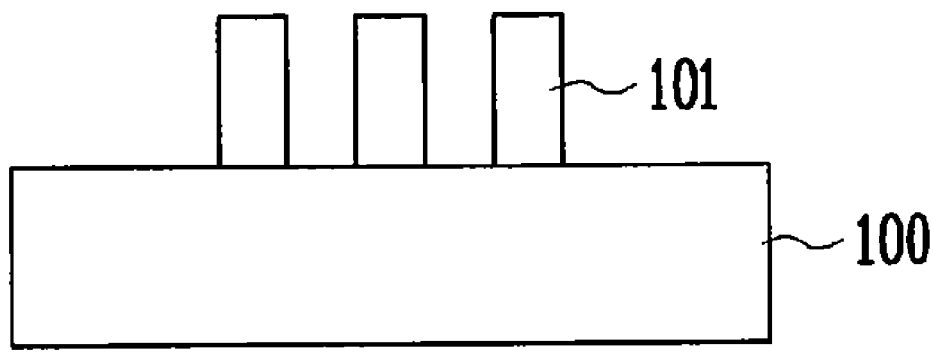

FIGS. 3A and 3D are sectional views illustrating a method of forming an isolation layer of a semiconductor device according to a second embodiment of the present invention.

The processes described in FIGS. 2A and 2B with reference to the first embodiment are identical to those of the second embodiment and a detailed description thereof is omitted for simplicity. Further, reference numerals of FIGS. 2A to 2F are used to designate the same parts of FIGS. 3A and 3D.

Referring to FIG. 3A, an auxiliary layer 106 is formed on the entire surface of a to-be-etched layer 101 including first etch mask patterns 105. Specifically, the auxiliary layer 106 is formed on sidewalls and top surfaces of the first etch mask patterns 105. Spaces between the first etch mask patterns 105 may exist that are as wide as the pitch of the first etch mask patterns 105. The auxiliary layer 106 can be formed of a carbon layer containing hydrogen. If the auxiliary layer 106 is formed of the carbon layer containing hydrogen, the thickness of the auxiliary layer 106 formed on the sidewalls of the first etch mask patterns 105 may be constant. Alternatively, the auxiliary layer 106 formed on upper sidewalls of the first etch mask patterns 105 may be thinner than the auxiliary layer 106 formed on lower sidewalls of the first etch mask patterns 105.

Referring to FIG. 3B, a second etch mask material is deposited on the entire surface including the auxiliary layer 106. Second etch mask patterns 107 are formed by performing an etch process such that an etch mask material remains in concave portions of the auxiliary layer 106. The second etch mask patterns 107 can be formed of a MFHM such as a BARC layer containing Si.

Referring to FIG. 3C, an etch process is performed to remove the exposed auxiliary layer such that the first etch mask patterns 105 and the second etch mask patterns 107 are exposed. The auxiliary layer 106 remains below the second etch mask pattern 107. The second etch mask pattern 107 has a reversed trapezoidal shape having an upper width that is larger than a lower width.

A pitch 'B' of the first etch mask pattern 105 and the second etch mask pattern 107 is half the pitch of the photoresist patterns 104 shown in FIG. 2A.

Referring to FIG. 3D, the to-be-etched layer is patterned by performing an etch process employing the first etch mask patterns 105 and the second etch mask patterns 107 as an etch mask, thereby forming micro patterns 101.

As described above, according to the present invention, in a formation process of micro patterns of a semiconductor device, first etch mask patterns are formed using photoresist patterns employing an exposure process. An auxiliary layer of a specific thickness is formed on sidewalls of the first etch mask patterns. Second etch mask patterns are formed in spaces between the first etch mask patterns. Micro patterns are then formed by employing the first and second etch mask patterns as an etch mask. Accordingly, micro patterns can be formed to have a pitch that is half or less than resolutions of an exposure apparatus.

The embodiments disclosed herein have been proposed to allow a person skilled in the art to easily implement the present invention, and the person skilled in the part may implement the present invention by a combination of these embodiments. Therefore, the scope of the present invention is not limited by or to the embodiments as described above, and should be construed to be defined only by the appended claims and their equivalents.

What is claimed is:

1. A method of forming patterns of a semiconductor device, the method comprising:
   forming a to-be-etched layer over a semiconductor substrate;
   forming first etch mask patterns over the to-be-etched layer;
   forming an auxiliary layer along an entire surface of the to-be-etched layer and the first etch mask patterns, wherein the auxiliary layer is thicker on upper sidewalls of the first etch mask patterns than on lower sidewalls of the first etch mask patterns;
   forming second etch mask patterns such that an upper width of the second etch mask patterns is smaller than a lower width of the second etch mask patterns in concave portions of the auxiliary layer;
   removing the auxiliary layer between the first and second etch mask patterns; and
   patterning the to-be-etched layer using the first and second etch mask patterns as an etch mask.

2. The method of claim 1, wherein the to-be-etched layer comprises a Spin On Carbon (SOC) layer.

3. The method of claim 1, wherein the first etch mask patterns and the second etch mask patterns comprise a Multi-Functional Hard Mask (MFHM).

4. The method of claim 3, wherein the MFHM is a Bottom Anti-Reflective Coating (BARC) layer containing silicon.

5. The method of claim 1, wherein forming the first etch mask patterns comprises forming the first etch mask patterns with a pitch that is approximately twice as large as a pitch of the second etch mask patterns.

6. The method of claim 1, wherein the auxiliary layer comprises a carbon layer containing fluorine.

7. A method of forming patterns of a semiconductor device, the method comprising:
   forming a to-be-etched layer over a semiconductor substrate;
   forming first etch mask patterns over the to-be-etched layer;
   forming an auxiliary layer along an entire surface of the to-be-etched layer and the first etch mask patterns, wherein the auxiliary layer comprises a carbon layer containing fluorine;
   forming second etch mask patterns such that an upper width of the second etch mask patterns is smaller than a lower width of the second etch mask patterns in concave portions of the auxiliary layer;
   removing the auxiliary layer between the first and second etch mask patterns; and
   patterning the to-be-etched layer using the first and second etch mask patterns as an etch mask.

8. The method of claim 7, wherein the to-be-etched layer comprises a SOC layer.

9. The method of claim 7, wherein the first etch mask patterns and the second etch mask patterns comprise a MFHM.

10. The method of claim 7, wherein the MFHM comprises a BARC layer containing silicon.

11. The method of claim 7, wherein forming the first etch mask patterns comprises forming the first etch mask patterns with a pitch that is approximately twice as large as a pitch of the second etch mask patterns.

* * * * *